(12) United States Patent
Allam et al.

(10) Patent No.: US 11,988,716 B2
(45) Date of Patent: May 21, 2024

(54) BATTERY MONITORING SYSTEM

(71) Applicant: The Board of Trustees of the Leland Stanford Junior University, Stanford, CA (US)

(72) Inventors: Anirudh Allam, Mountain View, CA (US); Simona Onori, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 311 days.

(21) Appl. No.: 17/438,136

(22) PCT Filed: Mar. 16, 2020

(86) PCT No.: PCT/US2020/022999
§ 371 (c)(1),
(2) Date: Sep. 10, 2021

(87) PCT Pub. No.: WO2020/186269
PCT Pub. Date: Sep. 17, 2020

(65) Prior Publication Data
US 2022/0163589 A1 May 26, 2022

Related U.S. Application Data

(60) Provisional application No. 62/818,642, filed on Mar. 14, 2019.

(51) Int. Cl.
*G01R 31/367* (2019.01)
*G01R 31/3842* (2019.01)
(Continued)

(52) U.S. Cl.
CPC ....... *G01R 31/367* (2019.01); *G01R 31/3842* (2019.01); *G01R 31/392* (2019.01); *H02J 7/0048* (2020.01); *H02J 7/005* (2020.01)

(58) Field of Classification Search
None
See application file for complete search history.

(56) References Cited

U.S. PATENT DOCUMENTS

| 2011/0077880 A1 | 3/2011 | Gering |
| 2013/0006454 A1 | 1/2013 | Li et al. |

(Continued)

FOREIGN PATENT DOCUMENTS

| EP | 3938796 A1 | 1/2022 |
| WO | 2018123322 A1 | 7/2018 |
| WO | 2020186269 A1 | 9/2020 |

OTHER PUBLICATIONS

Extended European Search Report for European Application No. 20768895.3, Search completed Nov. 22, 2022, dated Dec. 1, 2022, 11 Pgs.

(Continued)

*Primary Examiner* — Jas A Sanghera

(57) ABSTRACT

A battery health monitoring system that utilizes adaptive cathode and adaptive anode observers to estimate the ion concentrations at the respective cathode and anode of a battery. Subsequently, the estimated ion concentrations can be used in a battery model to estimate the state of heath and state of charge of the battery. Additionally, the model and ion concentrations can be updated real time as aging components of the battery are evaluated in the output data from the battery.

19 Claims, 11 Drawing Sheets

(51) Int. Cl.
G01R 31/392 (2019.01)
H02J 7/00 (2006.01)

(56) References Cited

U.S. PATENT DOCUMENTS

| | | | |
|---|---|---|---|
| 2014/0350877 A1 | 11/2014 | Chow et al. | |
| 2015/0111077 A1* | 4/2015 | Paik | H01M 50/124 |
| | | | 205/59 |
| 2015/0143885 A1* | 5/2015 | Konig | G01M 15/02 |
| | | | 73/115.01 |
| 2015/0231986 A1 | 8/2015 | Li | |
| 2018/0198300 A1* | 7/2018 | Howey | H01M 10/045 |
| 2019/0165432 A1* | 5/2019 | Park | G01R 31/387 |

OTHER PUBLICATIONS

International Preliminary Report on Patentability for International Application PCT/US2020/022999, dated Aug. 25, 2021, dated Sep. 23, 2021, 9 Pgs.
International Search Report and Written Opinion for International Application No. PCT/US2020/022999, Search completed May 11, 2020, dated Jun. 23, 2020, 17 Pgs.
Ahmed et al., "Model-Based Parameter Identification of Healthy and Aged Li-ion Batteries for Electric Vehicle Applications", International Journal of Alternative Powertrains, 2015, vol. 4, No. 2, pp. 233-247, doi:10.4271/2015-01-0252.
Allam et al., "An Interconnected Observer for Concurrent Estimation of Bulk and Surface Concentration in the Cathode and Anode of a Lithium-ion Battery", IEEE Transactions on Industrial Electronics, Sep. 1, 2018, vol. 65, Issue 9, pp. 7311-7321, doi: 10.1109/TIE.2018.2793194.
Allam et al., "Battery Health Management System for Automotive Applications: A retroactivity-based aging propagation study", in American Control Conference, 2015, pp. 703-716.
Arora et al., "Mathematical Modeling of the Lithium Deposition Overcharge Reaction in Lithium-Ion Batteries Using Carbon-Based Negative Electrodes", Journal of the Electrochemical Society, 1999, vol. 146, Issue 10, pp. 3543-3553, DOI: https://doi.org/10.1149/1.1392512.
Bizeray et al., "Identifiability and Parameter Estimation of the Single Particle Lithium-Ion Battery Model", arXiv:1702.02471v2 [cs. SY] Jan. 24, 2018, 16 pgs., DOI: 10.1109/TCST.2018.2838097.
Chaoui et al., "Lyapunov-Based Adaptive State of Charge and State of Health Estimation for Lithium-Ion Batteries", IEEE Transactions on Industrial Electronics, Mar. 2015, vol. 62, No. 3, pp. 1610-1618, DOI:10.1109/TIE.2014.2341576.
Dey et al., "Combined Estimation of State-Of-Charge and State-Of-Health of Li-Ion Battery Cells Using SMO On Electrochemical Model", 13th IEEE Workshop on Variable Structure Systems, 2014.
Dey et al., "Nonlinear Adaptive Observer for a Lithium-Ion Battery Cell Based on Coupled Electrochemical-Thermal Model", Journal of Dynamic Systems, Measurement and Control, Nov. 2015, vol. 137, pp. 111005-1-111005-12, DOI: 10.1115/1.4030972.
Dey et al., "Nonlinear Robust Observers for State-of-Charge Estimation of Lithium-Ion Cells Based on a Reduced Electrochemical Model", IEEE Transactions on Control Systems Technology, 2015, vol. 23, No. 5, pp. 1935-1942, DOI:10.1109/TCST.2014.2382635.
Di Domenico et al., "Lithium-Ion Battery State of Charge and Critical Surface Charge Estimation Using an Electrochemical Model-Based Extended Kalman Filter", Journal of Dynamic Systems, Measurement and Control, Nov. 2010, vol. 132, No. 6, pp. 061302-1-061302-11, first published Oct. 29, 2010, https://doi.org/10.1115/1.4002475.
Di Filippi et al., "Model-based life estimation of Li-ion batteries in PHEVs using large scale vehicle simulations: An introductory study", in Vehicle Power and Propulsion Conference (VPPC), IEEE Xplore, Oct. 2010 DOI:10.1109/VPPC.2010.5729020.
Docimo et al., "Multivariable state feedback control as a foundation for lithium-ion battery pack charge and capacity balancing", Journal of The Electrochemical Society, Jan. 2017, vol. 164, No. 2, pp. A61-A70, DOI:10.1149/2.0151702jes].
Du et al., "An adaptive sliding mode observer for lithium-ion battery state of charge and state of health estimation in electric vehicles", Control Engineering Practice, vol. 54, Sep. 2016, pp. 81-90, https://doi.org/10.1016/j.conengprac.2016.05.014.
Edouard et al., "Parameter sensitivity analysis of a simplified electrochemical and thermal model for Li-ion batteries aging", Journal of Power Sources, Sep. 1, 2016, vol. 325, pp. 482-494, https://doi.org/10.1016/j.jpowsour.2016.06.030.
Fan et al., "Modeling of Li-Ion Cells for Fast Simulation of High C-Rate and Low Temperature Operations", Journal of The Electrochemical Society, Feb. 2016, vol. 163, No. 5. pp. A666-A676, DOI:10.1149/2.0761605jes.
Fleischer et al., "On-line self-learning time forward voltage prognosis for lithium-ion batteries using adaptive neuro-fuzzy inference system", Journal of Power Sources, Dec. 2013, vol. 243, pp. 728-7490.
Fleischer et al., "On-line self-learning time forward voltage prognosis for lithium-ion batteries using adaptive neuro-fuzzy inference system", Journal Of Power Sources, Elsevier, Amsterdam, NL, Jun. 10, 2013, vol. 243, pp. 728-749, XP028693473,SSN: 0378-7753, DOI:10.1016/J. Jpowsour. 2013.05.114.
Forman et al., "Genetic Identification and Fisher Identifiability Analysis of the Doyle-Fuller-Newman Model from Experimental Cycling of a LiFePO4 Cell", Journal of Power Sources, 2010, Journal of Power Sources, 2010, 47 pgs., doi:10.1016/j.jpowsour. 2012.03.009.
Gao et al., "Estimation of State-of-Charge and State-of-Health for Lithium-Ion Degraded Battery Considering Side Reactions", Journal of the Electrochemical Society, Dec. 29, 2018, vol. 165, No. 16, pp. A4018-A4026, XP055717677, ISSN: 0013-4651, DOI: 10.1149/2.0981816jes.
Kim et al., "Effects of capacity ratios between anode and cathode on electrochemical properties for lithium polymer batteries", Electrochimica Acta, Feb. 10, 2015, vol. 155, pp. 431-436, https://doi.org/10.1016/j.electacta.2014.12.005.
Li et al., "A Nonlinear Adaptive Observer Approach for State of Charge Estimation of Lithium-Ion Batteries", 2011 American Control Conference, San Francisco, CA, Jun. 29-Jul. 1, 2011, pp. 370-375.
Likkas et al., "Combined battery SOC/SOH estimation using a nonlinear adaptive observer", 2015 European Control Conference (ECC), Linz Austria, Jul. 2015, 6 pgs., DOI:10.1109/ECC.2015. 7330754.
Limoge, "Reduced-Order Modeling and Adaptive Observer Design for Lithium-Ion Battery Cells", Thesis, Massachusetts Institute of Technology, Jun. 2017, 171 pgs.
Liu et al., "Synthesis and Experimental Validation of Battery Aging Test Profiles Based on Real-World Duty Cycles for 48-V Mild Hybrid Vehicles", IEEE Transactions on Vehicular Technology, Oct. 2017, vol. 66, No. 10, pp. 8702-8709, DOI:10.1109/TVT.2017. 2717187.
Moura et al., "Adaptive Partial Differential Equation Observer for Battery State-of-Charge/State-of-Health Estimation Via an Electrochemical Model", Journal of Dynamic Systems, Measurement, and Control, Jan. 2014, vol. 136, pp. 011015-1-011015-11, DOI: 10.1115/1.4024801.
Moura et al., "Battery State Estimation for a Single Particle Model With Electrolyte Dynamics", IEEE Transactions on Control Systems Technology, Mar. 2017, vol. 25, Issue: 2, first date of publication Jun. 10, 2016, DOI: 10.1109/TCST.2016.257166.
Moura et al., "Optimal Control of Film Growth in Lithium-Ion Battery Packs via Relay Switches", IEEE Transactions on Industrial Electronics, Aug. 2011, vol. 58, No. 8, pp. 3555-3566, first published Oct. 14, 2010, DOI: 10.1109/TIE.2010.2087294.
Nagpure et al., "Multi-Scale Characterization Studies of Aged Li-Ion Large Format Cells for Improved Performance: An Overview", Journal of The Electrochemical Society, 2013, vol. 160, No. 11, pp. A2111-A2154, DOI: 10.1149/2.001311jes.
Pinson et al., "Theory of SEI Formation in Rechargeable Batteries: Capacity Fade, Accelerated Aging and Lifetime Prediction", Journal

(56) References Cited

OTHER PUBLICATIONS of the Electrochemical Society, 2013, vol. 160, Issue 2, pp. A243-A250, DOI: 10.1149/2.044302jes.
Prada et al., "Simplified Electrochemical and Thermal Model of LifePO4-Graphite Li-Ion Batteries for Fast Charge Applications", Journal of The Electrochemical Society, Aug. 2012, vol. 159, No. 9, pp. A1508-A1519, DOI:10.1149/2.064209jes.
Ramadass et al., "Development of First Principles Capacity Fade Model for Li-Ion Cells", Journal of the Electrochemical Society, 2004, vol. 151, No. 2, pp. A196-A203, DOI: 10.1149/1.1634273.
Ramadass et al., "Mathematical modeling of the capacity fade of Li-ion cells", Journal of Power Sources, Sep. 20, 2003, vol. 123, Issue 2, pp. 230-240, https://doi.org/10.1016/S0378-7753(03)00531-7.
Renganthan et al., "Theoretical Analysis of Stresses in a Lithium Ion Cell", Journal of The Electrochemical Society, 2010, vol. 157, No. 2, pp. A155-A163, DOI: 10.1149/1.3261809.
Safari et al., "Multimodal Physics-Based Aging Model for Life Prediction of Li-Ion Batteries", Journal of The Electrochemical Society, Dec. 29, 2008, vol. 156, No. 3, pp. A145-A163, DOI:10.1149/1.3043429.
Samadi et al., "Identifiability analysis of an electrochemical model of li-ion batteries", American Control Conference (ACC), 2016, pp. 3107-3112.
Sikha et al., "Effect of Porosity on the Capacity Fade of a Lithium-Ion Battery: Theory", Journal of The Electrochemical Society, 2004, vol. 151, No. 7, pp. A1104-A1114, DOI: 10.1149/1.1759972.
Tanim et al., "A Temperature Dependent, Single Particle, Lithium Ion Cell Model Including Electrolyte Diffusion", Journal of Dynamic Systems, Measurement, and Control, Jan. 2015, vol. 137, pp. 011005-1-011005-11, DOI: 10.1115/1.4028154.
Vetter et al., "Ageing mechanisms in lithium-ion batteries", Journal of Power Sources, Sep. 9, 2005, vol. 147, Issues 1-2, pp. 269-281, https://doi.org/10.1016/j.jpowsour.2005.01.006.

\* cited by examiner

BATTERY MONITORING SYSTEM

CROSS-REFERENCED APPLICATIONS

This application is a national stage of PCT Application No. PCT/US20/22999 filed on Mar. 16, 2020, which claims priority to U.S. Provisional Patent Application No. 62/818,642 filed on Mar. 14, 2019. The disclosures of which are included herein by reference in their entireties.

FIELD OF THE INVENTION

The present invention generally relates to battery management systems and methods. More specifically, it relates to systems and methods for estimating the state of the battery.

BACKGROUND OF THE INVENTION

Battery aging is a natural process that contributes to a number of performance related factors that can change over time resulting in gradual degradation of the battery performance. With battery use, charging and discharging, capacity and power fade of the battery can change over time due to various factors including the growth of Solid Electrolyte Interphase layer. The aging and subsequent degradation of the battery performance can often result in reliability and safety issues. This is especially true for the application of larger batteries in all electric vehicles.

Many modern vehicle manufactures are moving production towards all electric vehicles which require large battery systems. Modern vehicles today have a variety of complex control systems including computer control units, engine control units, as well as battery management systems. Accordingly, all electric vehicles must be able to properly control the battery system as well as monitor the overall health of the system to account for battery degradation and overall safety. Battery monitoring is often generalized in terms of the Battery State of Charge (SOC) and State of Health (SOH) of the battery. SOC and SOH are directly related to the electrochemical concentration within the battery, the aging-sensitive transport parameters, and the total amount of cyclable lithium. The SOH term generally refers to the cell capacity and performance of the battery and is typically at 100% when manufactured and decreases over time. SOC generally refers to the concentration of transportable ions in the battery. SOC and SOH are critical variables in any battery management system and can be used to properly control the safe operation of the system without causing accelerated degradation or affecting the performance. Additionally, proper battery management can help to improve the warranty window on batteries.

Traditional battery management systems operate on a model based system to estimate the SOC and SOH for battery management. Model based systems operate on prediction models using algebraic relationships between the ion concentrations in both electrodes. Typically, this is done by assuming that the number of lithium, moles in both electrodes is conserved. Such assumptions, however, fail to take advantage of improvements in battery management technology resulting in inaccurate models.

BRIEF SUMMARY OF THE INVENTION

Many embodiments are directed to a battery monitoring system that is capable of estimating the SOC and SOH of the battery in real time utilizing dedicated adaptive cathode and anode observers in conjunction with a predictive modeling scheme to continually estimate and update ion concentrations for the respective cathode and anodes based on real time data and aging data input.

Many embodiments include a battery capable of generating an electric profile signal in the form of voltage and current data and an adaptive cathode observer configured to receive the electric profile signal with respect to a cathode of the battery, and an adaptive anode observer configured to receive the electric profile signal with respect to an anode of the battery. Each of the adaptive cathode and anode observers utilize an electrochemical model of the battery to generate data describing an estimated ion concentration at the cathode and the anode of the of the battery. Additionally, the electrochemical model is used to calculate a state of health and a state of charge of the battery wherein the adaptive cathode and adaptive anode observers update the estimated ion concentrations based on the calculated state of health and state of charge.

In other embodiments, the adaptive cathode and adaptive anode observers utilize open loop systems to estimate the respective ion concentrations within the battery.

In still other embodiments, the electrochemical model is a solid electrolyte interphase layer aging model.

In yet other embodiments, the adaptive cathode and adaptive anode observers are interconnected wherein each of the adaptive cathode and anode observers can utilize information from each of the respective observers to continuously update the estimated ion concentrations using the calculated state of health and state of charge of the battery.

In still yet other embodiments, the adaptive cathode and adaptive anode observers are integrated into an independent control unit that is connected to the battery through at least one electrical connection.

In other embodiments, the battery monitoring system has a graphical user interface system connected to the independent control unit wherein the calculated state of health and state of charge can be monitored.

In still other embodiments, the battery is a lithium ion battery.

In yet other embodiments, the estimated ion concentrations are lithium ion concentrations Other embodiments include a method for monitoring battery health where a battery with an anode and a cathode is provided. The method incorporates the use of an adaptive anode observer for estimating the ion concentration at the anode of the battery and an adaptive cathode observer for estimating the ion concentration at the cathode of the battery. The adaptive observers can utilize an electrochemical model within each of the adaptive anode and adaptive cathode observers to calculate an estimated state of charge and an estimated state of health of the battery using the estimated ion concentrations. The adaptive observers can then update their respective ion concentrations based on the calculated state of charge and calculated state of health of the battery. Ultimately, the electrochemical model can be update based on the updated ion concentrations to provide real time estimation of the changing state of health and state of charge of the battery.

Additional embodiments and features are set forth in part in the description that follows, and in part will become apparent to those skilled in the art upon examination of the specification or may be learned by the practice of the disclosure. A further understanding of the nature and advantages of the present disclosure may be realized by reference to the remaining portions of the specification and the drawings, which forms a part of this disclosure.

BRIEF DESCRIPTION OF THE DRAWINGS

The description will be more fully understood with reference to the following figures, which are presented as exemplary embodiments of the invention and should not be construed as a complete recitation of the scope of the invention, wherein.

DETAILED DESCRIPTION OF THE INVENTION

Figure 1:
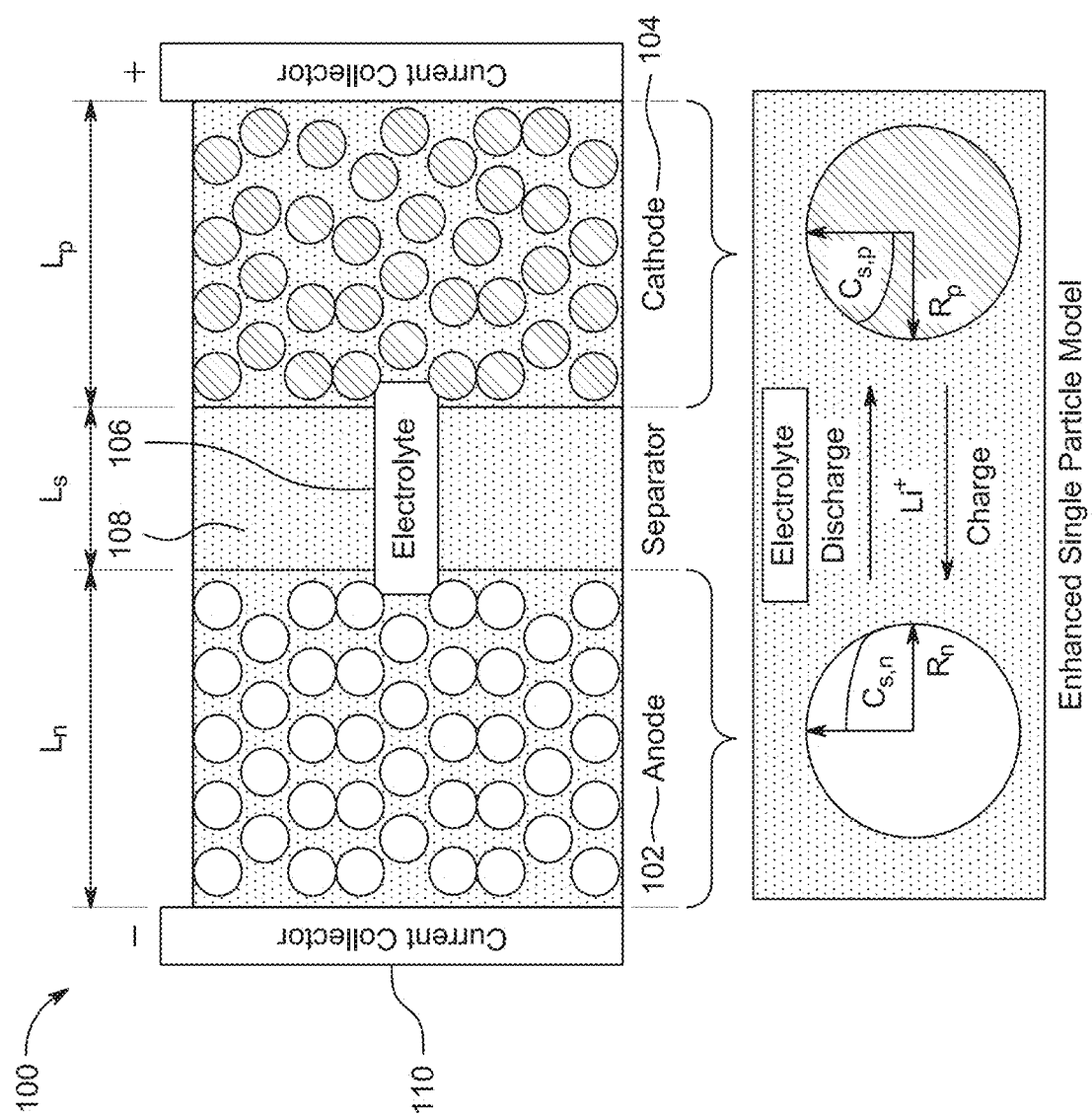
FIG. 1 illustrates an enhanced single particle model of a battery in accordance with embodiments of the invention.

Turning now to the drawings, many embodiments are directed to a real time modeling system for evaluating the overall battery health by providing real time testing and feedback to various components in a battery management system. Many embodiments include a battery management system with adaptive observer units integrated with the system to monitor and update battery aging parameters real time. In a number of embodiments, the battery management system is capable of adapting the aging parameters in real time as the aging of the battery ultimately affects the battery's performance. This allows for many embodiments to accurately illustrate to a user the real time battery status for improved usage.

In contrast, typical prediction models for battery management systems tend to rely heavily and focus on the development of the solid electrolyte interphase (SEI) layer growth within the battery. The SEI layer is often considered the dominant aging mechanism within batteries, and especially for lithium-ion type batteries. The SEI layer is a thin film formed around the active material in the negative electrode due to electrolyte decomposition and consumes the cyclable lithium ions. With use, the SEI layer gradually grows ultimately causing the battery capacity as well as the power to fade over time. Capacity fade is defined as the decrease in the discharge capacity of the battery over time. This is typically due to the loss of cyclable lithium ions consumed by the SEI layer. Power fade is defined as an increasing the internal resistance of the battery that results in a decrease in the power that can be delivered to the load.

Model-based methods towards estimating battery SOC and SOH are the traditional and well researched approach. Such traditional approaches, often fail to consider the aging of the battery and how aging affect the physical battery parameters, such as, but not limited to, the transport parameters. Moreover, the traditional fixed-parameter model will yield estimates that will slowly diverge over time. This tends to result in incorrect estimations of the battery's SOC and SOH. One way to counter the diverging models would be to use dynamic modeling systems. Dynamic modeling systems are typically physics-based or semi-empirical type modeling systems. Dynamic modeling systems based on physics are often not viable for real-time implementation. This is due to complexities that result from the lack of comprehensive knowledge of the electrochemical aging mechanism Semi-empirical models can offer decreased complexity, but tend to sacrifice the accuracy needed for proper estimation in battery management. Additionally, the physics based models, as well as the semi-empirical models, require extensive data for characterization, which results in large cumbersome look-up tables for model parameters. Moreover, accuracy of these models cannot be guaranteed as the battery ages.

Adaptive observers, which update battery parameters dynamically as the battery ages, have been in development in various situations. Adaptive observers work by updating battery parameters dynamically with aging without using any aging models or detailed experimental characterization spanning the lifetime of the battery. Current adaptive observers are typically based on circuit models which operate by adapting the circuit parameters as aging progresses. Updating the circuit parameters as the battery ages does not have any actual correlation to the physical battery parameters. Therefore, such models provide little value in terms of modern battery management systems.

On the other hand, electrochemical models, such as a Single Particle Model (SPM), can capture the concentration states and the parameters that represent actual physical battery parameters. The SPM is a reduced-order electrochemical model that approximates each electrode by a spherical particle and neglects electrolyte concentration and migration dynamics in electrolyte phase. This can help to predict the concentration states, but the electrochemical model-based estimation does not incorporate aging mechanisms and/or parameters that would affect the SOC and SOH of the battery.

Hence, there is a need to develop an adaptive observer type modeling system that incorporates aging parameters and can accurately determine the SOC and SOH of a battery in real time without the need for large cumbersome databases requiring an additional computation burden on the system. Additionally, the framework must be adaptable to any number of battery chemistries so as to allow additional degradation mechanisms to be incorporated. Accordingly, many embodiments draw from the strengths of adaptive estimation theory with physics-based modeling insights while incorporating the use of degradation mechanisms and aging-sensitive parameters into open looped monitoring systems. To address these issues, numerous embodiments, incorporate an Enhanced Single Particle Model to incorporate aging parameters and produce effective real time battery health data.

Enhanced Single Particle Model

Enhanced Single Particle Models (ESPMs) are single particle prediction models that incorporate battery aging parameters that can change over time as well as affect the battery's performance. ESPMs form the basis for adaptive interconnected observers and exploit the relationship between battery capacity and battery fade. Battery fade and capacity are affected by the growth of SEI layer in the battery. Moreover, ESPMs enable the combined estimation of states (lithium concentration in both electrodes and cell capacity) and aging sensitive transport parameters (anode diffusion coefficient and SEI layer conductivity) that enable adaptive interconnected observes to accurately predict the battery state of health in real time.

FIG. 1 illustrates an example embodiment of an Enhanced Single Particle Model 100 that can be used in the simulation of the transport of ions in the solid and electrolyte phase and predict battery voltage. The ESPM 100 can be broken down into five basic components; an anode 102, a cathode 104, electrolyte 106, a separator 108, and two current collectors 110. In accordance with many embodiments, the predicted voltage of an ESPM is the potential difference between the cathode 104 and the anode 102 and can be illustrated in equation (1) below.

$$V(T) = [U_p(C_{s,p,surf},T) +$$
$$\eta_p(C_{s,p,surf},T, I_{batt})] - [U_n(C_{s,n,surf},T) + \eta_n(C_{s,n,surf},T, I_{batt})] +$$
$$\frac{2R_g T(1-t_0^+)v(T)}{F} \ln\frac{C_e(L)}{C_e(0)} - I_{batt}(T)R_{e,0} - I_{batt}(t)R_l$$

V (t) is the terminal voltage predicted by the ESPM 100 in accordance with numerous embodiments. The prediction of the terminal voltage is based on several key parameters such as the open circuit potential ($U_p$), the concentration at the surface ($C_j$), temperature (T), input current of the battery ($I_{batt}$), Faradays constant (F), the Universal Gas constant ($R_g$) and the particle radius ($R_j$). Furthermore, the electrolyte resistance can be expressed by $R_{e,0}$.

In accordance with many embodiments, the ESPM model can incorporate functions to consider the increasing growth of an SEI layer. In many embodiments, the SEI layer growth is considered to be a major degradation mechanism, and hence anode diffusion coefficient and SEI layer ionic conductivity are chosen as the parameters of interest that are assumed to change with degradation. The relationship between power fade and capacity fade due to SEI layer growth can be derived to relate the chosen aging-affected parameters to the cell capacity, at any given time. The changes in anode diffusion due to SEI layer are well documented, and the lowering of ionic conductivity in SEI layer can be interpreted from the growing SEI layer thickness and subsequent increasing SEI layer resistance offered to the transport of lithium ions. Both parameters can be moderately sensitive to the output voltage, and hence can be estimated with a reasonable level of accuracy. In various embodiments, the state space formulation for an ESPM that accounts for the aging-based parameters can be illustrated by equation 2 below. Where the parameter variables are described in greater detail in Table 1 below.

$$\dot{x}_1(t) = A_{11}(T)x_1(t) + B_1 u(t)$$
$$\dot{x}_2(t) = \theta_1(T)\bar{A}_{22}x_2(t) + B_2 u(t)$$
$$\dot{x}_3(t) = 0$$
$$\dot{x}_4(t) = f_e(x_4, T, u)$$
$$y(t) = h_1(x_{1,N}, T, u) - h_2(x_{2,N}, T, u) - h_3(x_3)u + h_4(x_4, T, u) - R_1 u + (x_3 - Q_0)\theta_2 u \quad \text{Equation 1}$$

TABLE 1

| Input Variable | Variable Description |
| --- | --- |
| $x_1$ | Solid phase lithium concentration in cathode |
| $x_2$ | Solid phase lithium concentration in anode |
| $x_3$ | Cell capacity |
| $\theta_1$ | Solid-phase diffusion coefficient in the anode |
| $\theta_2$ | SEI layer ionic conductivity |

TABLE 1-continued

| Input Variable | Variable Description |
| --- | --- |
| y | Cell Voltage |
| u | Current Signal |

In accordance with many embodiments, accurate knowledge of battery SOC/SOH using an electrochemical model, such as an ESPM described above, is attainable by estimating the following state variables: 1) lithium concentration in cathode, 2) lithium concentration in anode, and 3) total cell capacity. However, accurate model-based state estimation over the entire lifespan of a battery is often contingent on how well the model predicts the battery response as it ages. Naturally, when model parameters vary with usage and time, state estimates of capacity and electrolyte concentration diverge from their respective true values. Studies have shown that aging-sensitive transport parameters such as diffusion and conductivity change with aging. Therefore, many embodiments may utilize an adaptive scheme that updates the time-varying aging-sensitive parameters in real-time to ensure that model-based estimation of capacity and electrolyte concentration remains accurate over time. For this purpose, many embodiments incorporate the use of an adaptive observer capable of combined estimation of states and parameters. Such observer structures are discussed in further detail below.

Sliding Mode Interconnected Observers

In accordance with many embodiments, a sliding mode interconnected observer structure can be used for the implementation of the adaptive observer. A sliding mode interconnected observer type system allows for concurrent estimation of concentration at both electrodes by providing an adaptive observer dedicated for each electrode (cathode and anode). Furthermore, the dedicated observers are interconnected that allow for communication between observers to enhance the prediction models. The sliding mode interconnected observer model allows the estimation of electrode-specific geometrical and transport parameters, despite any inaccurate initialization in either electrode. The observability issues associated with estimating states from both electrodes can be circumvented by connecting each of the dedicated electrode observers with an open loop model of the other electrode that is constantly updated with the correct estimates. In accordance with many embodiments, the sliding mode structure features robustness to modeling uncertainties and easier real-time on-board implementation.

Figure 2:
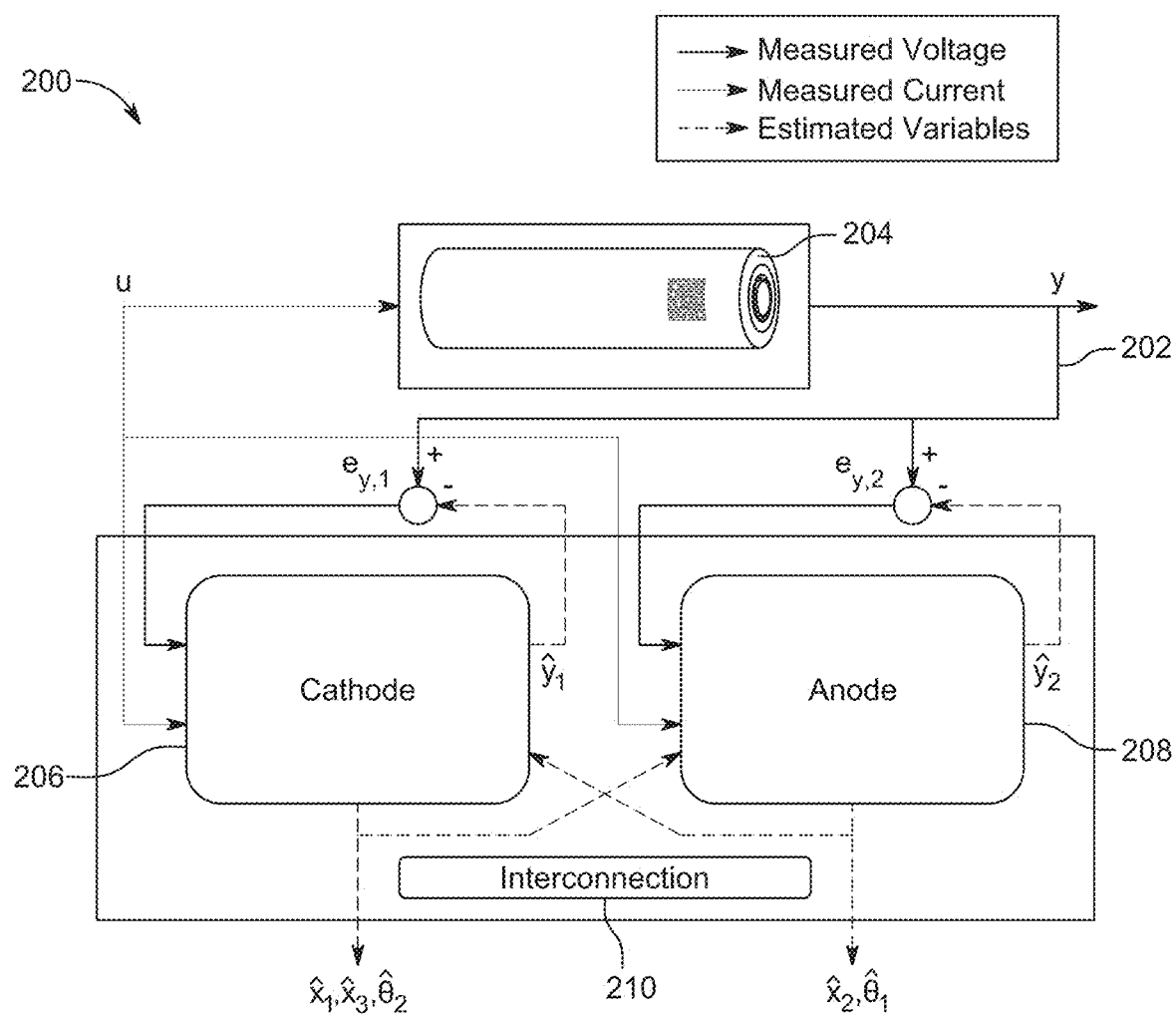
FIG. 2 illustrates a battery and adaptive observer connection loop in accordance with embodiments of the invention.

FIG. 2 illustrates an embodiment of an interconnected adaptive observer 200 that may be incorporated into a battery management system in accurately predicting the SOC and SOH of the battery. In many embodiments, the observer 200 is fed with measured current voltage 202 of the battery 204. The measured values (i.e. voltage and current) is illustrated by the solid indicator lines, while the estimated values can be illustrated by the dashed lines. Accordingly, in many embodiments the cathode observer 206 estimates the ion concentration in the cathode, the cell capacity, and the SEI layer ionic conductivity. In many embodiments, an anode observer 208 estimates the ion concentration in the anode and the anode diffusion coefficient. In accordance with many embodiments, the anode and cathode observers (206, and 208) are interconnected through a bidirectional interconnection 210. The bidirectional interconnection 210 allows for the communication between adaptive observers with open loop programing. This helps to ensure the ultimate convergence of each of the observers, despite incorrect initialization in states and parameters. It can be appreciated that the ion concentrations for any given battery can be measured and/or estimated utilizing the systems and methods described herein. In many embodiments, the ion concentrations may be related to a lithium ion battery or any battery in the lithium ion family. Some embodiments may be related to an aluminium-ion battery, carbon battery, magnesium-ion battery, metal-air electrochemical cell battery, etc. and/or any number of batteries.

It can be appreciated that the interconnected framework can be easily extended to incorporate different degradation mechanisms that affect other parameters at either electrode, since there is a dedicated observer running for each electrode. The interconnected observer is fed with measured current and voltage of the battery. The cathode observer estimates the lithium concentration in the cathode, the cell capacity, and the SEI layer ionic conductivity. Whereas, the anode observer estimates the lithium concentration in the anode, and the anode diffusion.

While such systems presented in FIGS. 1 and 2 can be appropriate for state estimation with fixed battery model parameters from fresh batteries, many embodiments incorporate adaptive observers that are capable of convergence for a battery with aging-sensitive parameters that are varying slowly over time. Each of the observers (cathode and anode) can utilize unique formulations to account for the changing parameters as illustrated in equations 3 and 4 respectively below.

$$\dot{x}_1 = A_{11}\hat{x}_1 + B_1 u + G_1(y-\hat{y}_1) + G_{v1}\,\mathrm{sgn}(y-\hat{y}_1)$$

$$\dot{x}_{2,ol} = \hat{\theta}_1 \bar{A}_{22}\hat{x}_2 + B_2 u$$

$$\dot{x}_3 = G_3(y-\hat{y}_1)u$$

$$\hat{y}_1 = h_1(\hat{x}_{1,N},u) - h_2(\hat{x}_{2,N,ol},u) - R_l u - h_3(\hat{x}_3) \text{Equation 3, Cathode Observer}$$

$$\dot{x}_{1,ol} = A_{11}\hat{x}_1 + B_1 u$$

$$\dot{x}_2 = \hat{\theta}_1 \bar{A}_{22}\hat{x}_2 + B_2 u + G_2(y-\hat{y}_2) + G_{v2}\,\mathrm{sgn}(y-\hat{y}_2)$$

$$\hat{y}_2 = h_1(\hat{x}_{1,N,ol},u) - h_2(\hat{x}_{2,N},u) - R_l u - h_3(\hat{x}_3)u \text{ Equation 4, Anode Observer}$$

The subscript ol in the formulations for the anode and cathode observers represents variables for the open loop state model. $G_1$, $G_2$, and $G_3$, are constant linear observer gains, and $G_{v1}$ and $G_{v2}$ are variable structure gains introduced to improve robustness against uncertainties. The cell current is illustrated by the variable u while the cell voltage by the variable y. $X_1$ represents the estimated solid phase lithium concentrations in the cathode by the cathode observer. $X_2$ represents the estimated lithium concentrations in the anode by the anode observer. The estimated cell capacity by the cathode observer is illustrated by $X_3$. $\Theta_1$ is the estimated solid-phase diffusion coefficient in the anode while $\Theta_2$ is the estimated SEI layer iconic conductivity by the cathode observer. The estimated solid-phase lithium concentration in both the cathode and anode observers in the open loop mode are illustrated by $X_{1,ol}$ and $X_{2,ol}$. $R_l$ is the lumped cell resistance while $Q_0$ is the actual or measured cell capacity. $A_{11}$, $B_1$, $A_{22}$, and $B_2$ refer to the state space matrices which represent coefficients of the concentration states ($A_{11}$ and $A_{22}$) and coefficients of the input current ($B_1$ and $B_2$). Finally, $h_1(\cdot)$ $h_2(\cdot)$ and $h_3(\cdot)$ are the nonlinearities in the terminal voltage of the battery.

The observer formulations above exploit the understanding of the cycling between electrodes. For example, as concentration in one electrode increases with use the concentration in the other electrode will decrease. Accordingly, the above referenced electrode formulations can be used in maintaining the stability of the system. In a variety of embodiments, the interconnected observer can be further stabilized by utilizing a bidirectional exchange of information between the cathode and anode observers. This creates the basis for a sliding mode interconnected observer in which information is shared between electrode observers to ensure accurate and timely predictability of the battery health. In a number of embodiments, the sliding mode interconnected observer can be used in an overall battery management system in order to provide real time information on the battery SOC and SOH.

Battery Management System

Figure 3:
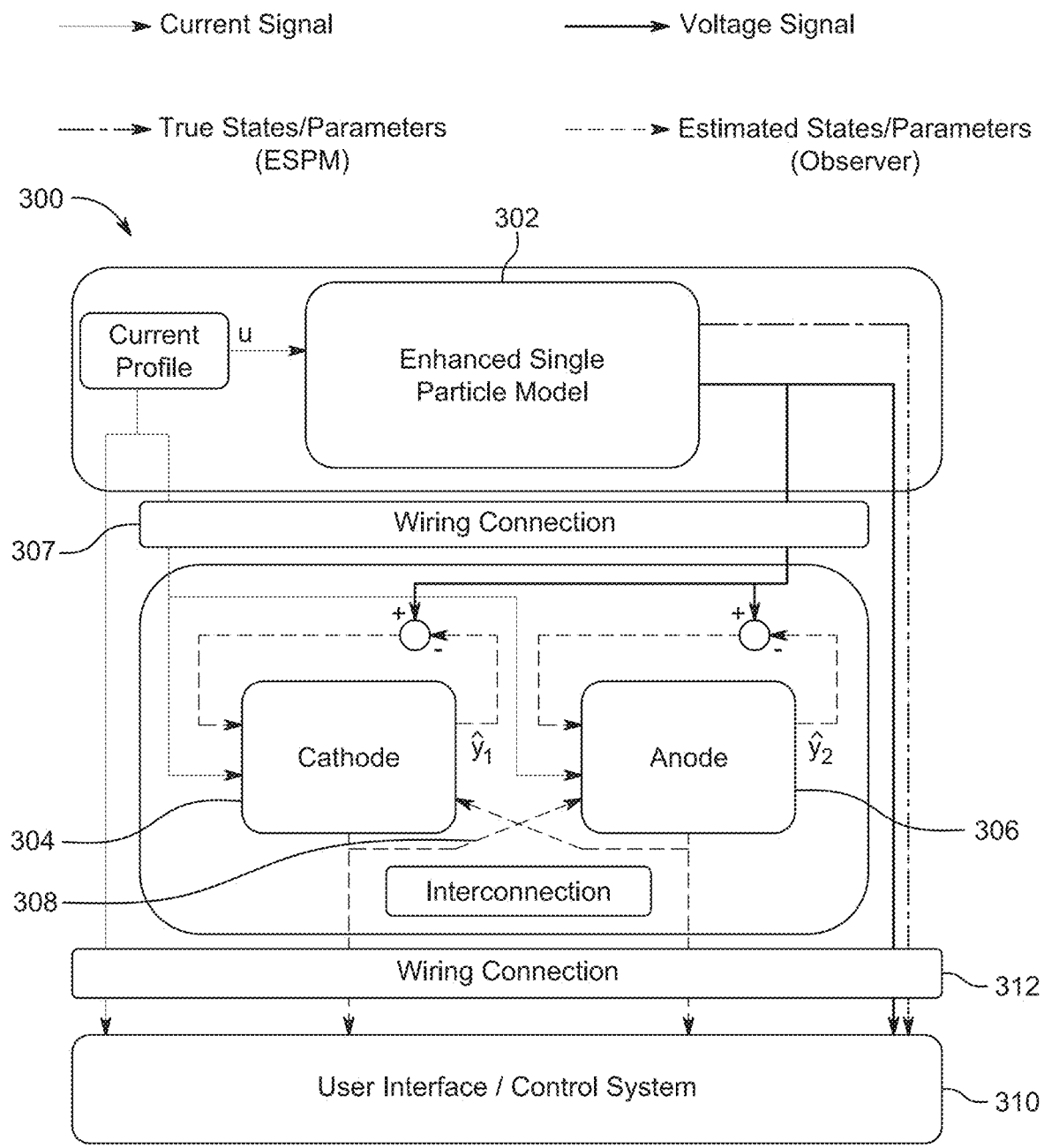
FIG. 3 illustrates a schematic of a battery monitoring system in accordance with embodiments of the invention.

In accordance with many embodiments, FIG. 3 illustrates a battery management system 300 that may utilize the ESPM parameters considerations illustrate in equation 2 in conjunction with the observer formulations in equations 3 and 4. In accordance with many embodiment the battery system, represented by the ESPM 302 can feed parameter information based on Table 1 above into the respective cathode observer 304 and anode observer 306 via electronic connections 307. In accordance with many embodiments, the respective formulations can be used in conjunction with the bidirectional interconnection 308 between observers to produce real time estimations of the overall battery SOC and SOH. In accordance with many embodiments, output variables used in the estimation of the SOC and SOH can be expressed in table 2 below.

TABLE 2

| Estimation variable | Variable Description |
|---|---|
| $\hat{x}_1$ | Estimated solid phase lithium concentration in cathode (Observer) |
| $\hat{x}_2$ | Estimated solid phase lithium concentration in anode (Observer) |
| $\hat{x}_3$ | Estimated Cell capacity (Observer) |
| $\hat{\theta}_1$ | Estimated Solid-phase diffusion coefficient in the anode (Observer) |
| $\hat{\theta}_2$ | Estimated SEI layer ionic conductivity (Observer) |

In accordance with many embodiments, the battery management system 300 may also incorporate a monitor and control system 310 that is connected to the battery module 302 as well as both the cathode and anode observers via an electronic connection 312. The monitor and control system 310, in many embodiments, can monitor the system signals in real time and provide feedback necessary to tune the variables or parameters. Additionally, in many embodiments, the monitor and control system 301 can record the data for future analysis.

Figure 4A:
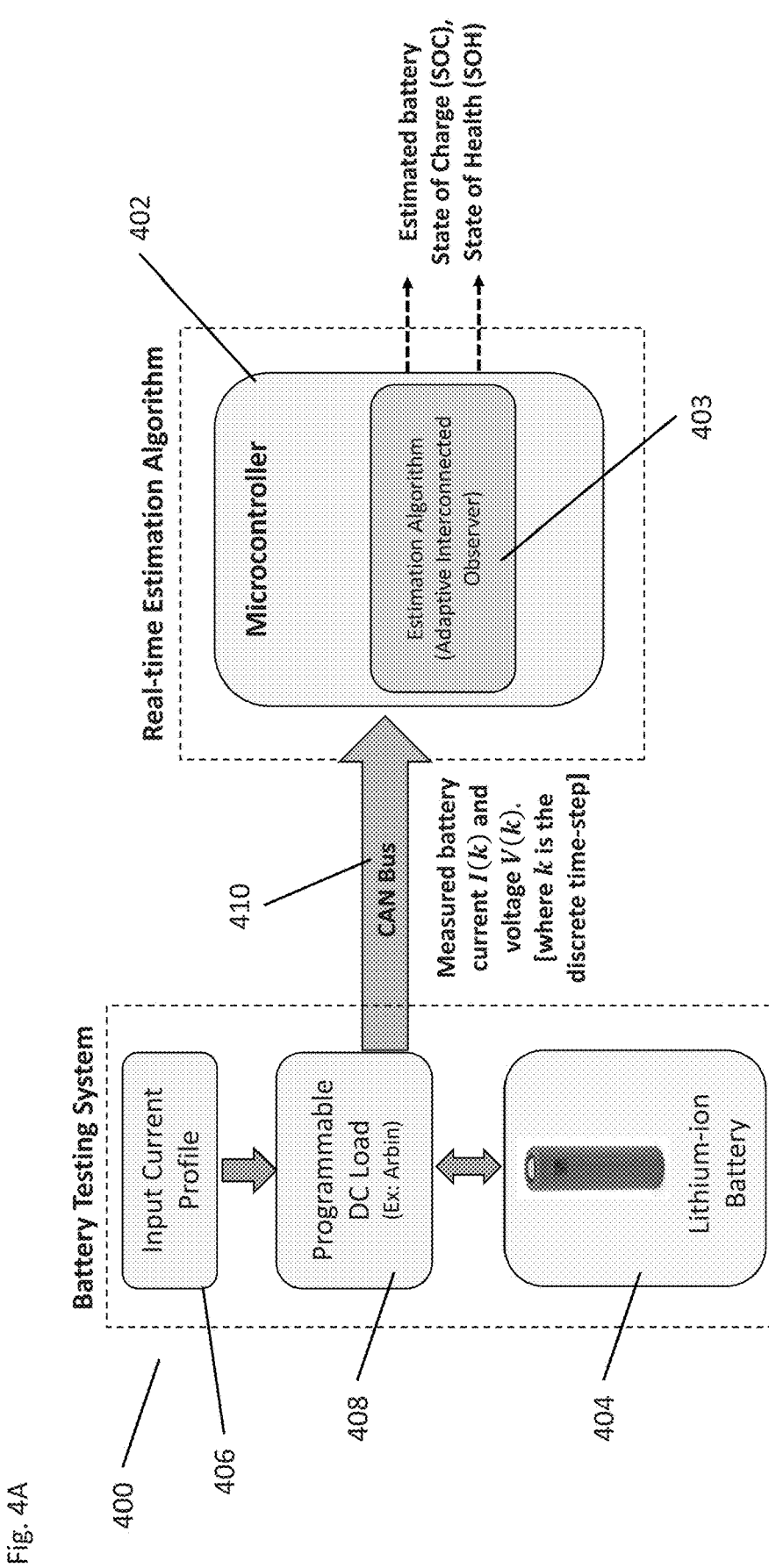
FIGS. 4A and 4B illustrate battery monitoring systems in accordance with embodiments of the invention.
Figure 4B:
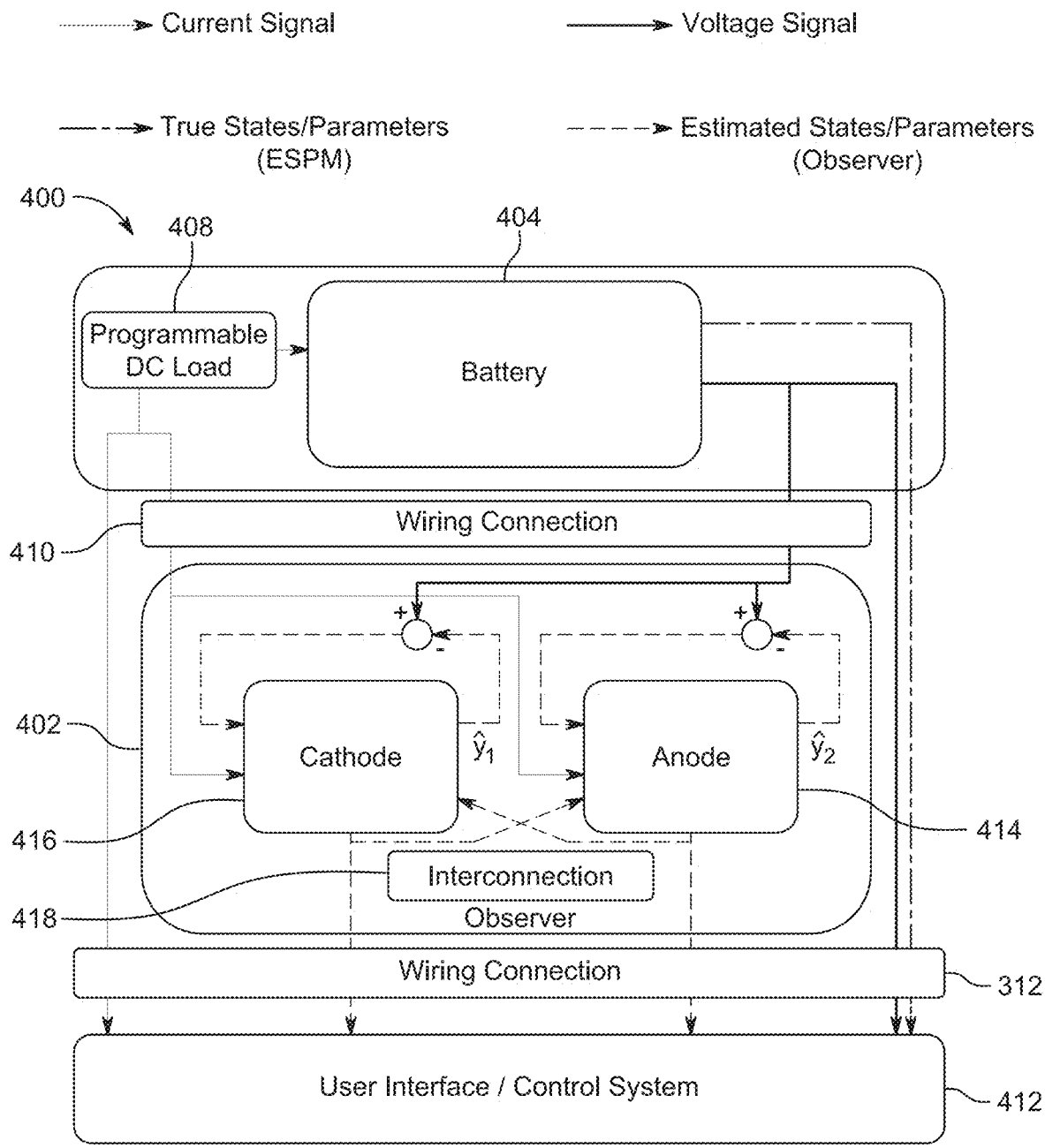

Turning now to FIGS. 4A and 4B schematic illustrates of validation methods are illustrated. For example FIG. 4A illustrates a general schematic of a battery in the loop (BIL) system 400 for testing and validating the adaptive interconnected observer system which includes the estimation algorithms as previously discussed. In accordance with numerous embodiments, a microcontroller 402 can be programmed to run both the anode and cathode observer estimation algorithms 403 that will receive data from an actual battery status and estimate the overall SOC and SOH of the battery. In many embodiments, the BIL system 400 will have an actual battery 404 with a known capacity. The battery 404 can be subjected to an input current profile 406 from a programmable Direct Current (DC) load 408. Accordingly, the measured load can be sent to the controller 402 in real time by way of an electronic connection 410.

Within the microcontroller 402, the adaptive interconnected observer program 403 can then be used to estimate the SOC and SOH of the batter in real time. It should be under stood that many embodiments may incorporate a variety of controllers to run the interconnected observer programs. For example, some embodiments may use a dSpace MicroAutoBox-II. As can also be appreciated, many embodiments may utilize a variety of electronic connections that can allow for the communication, in real time, of the measured signals from the battery to the controller module. In many embodiments, the connection may be a Controller Area Network (CAN) connection with specific ports for transmitting real time data.

In other embodiments, the BIL system 400 may contain a user interface/control system 412 as illustrated in FIG. 4B. FIG. 4B illustrates an expanded schematic of the BIL system from FIG. 4A. In various embodiments, the system may have a control module 402 that consists of both the anode 414 and cathode 416 observers. In essence the control module 402 operates to as a dual observer system to operate both the anode 414 and cathode 416 programs and utilizes interconnected data 418 to update and estimate the SOC and SOH in real time. As can be appreciated many embodiments may incorporate an actual battery system 404 that receives a current load from the programmable DC load 408. In a number of embodiments, the system 400 may incorporate electronic connections 410 between the control module 402 and the battery system (404, 406, and 408), similar to that illustrated in FIG. 4A. Many embodiments may the user interface system 412 as a method to analyze the data and subsequently validate the accuracy of the system. It can be appreciated that many embodiments may use a form of electronic connections 420 such as Ethernet to connect the user interface 412 to the control module 402 and the battery system (404, 406, and 408). Although FIGS. 4A and 4B illustrated embodiments of a BIL validation system, it can be appreciated that such system architecture can be used and/or implemented in real world applications such as electronic vehicles. For example, electronic vehicles that have a battery system can utilize control modules that are programmed to function as a dual adaptive interconnected observer system and operate to monitor the SOC and SOH of the vehicle's battery. Additionally, many embodiments may integrate the dual adaptive interconnected observer system to provide user feedback while operating the vehicle. For example, many embodiments may utilize a vehicle's "infotainment" system as the user interface 412 and have it be connected to the adaptive interconnected observer control module 402 to provide real time feedback to the user in the form of battery life or distance remaining on the charge. Additionally, many embodiments may be adapted to interpret the SOC and SOH data to inform a user of the real time status of the battery to aid in the overall vehicle use. The validation data of a BIL system can best be illustrated in the graphs shown in FIGS. 4C and 4D.

Figure 4C:
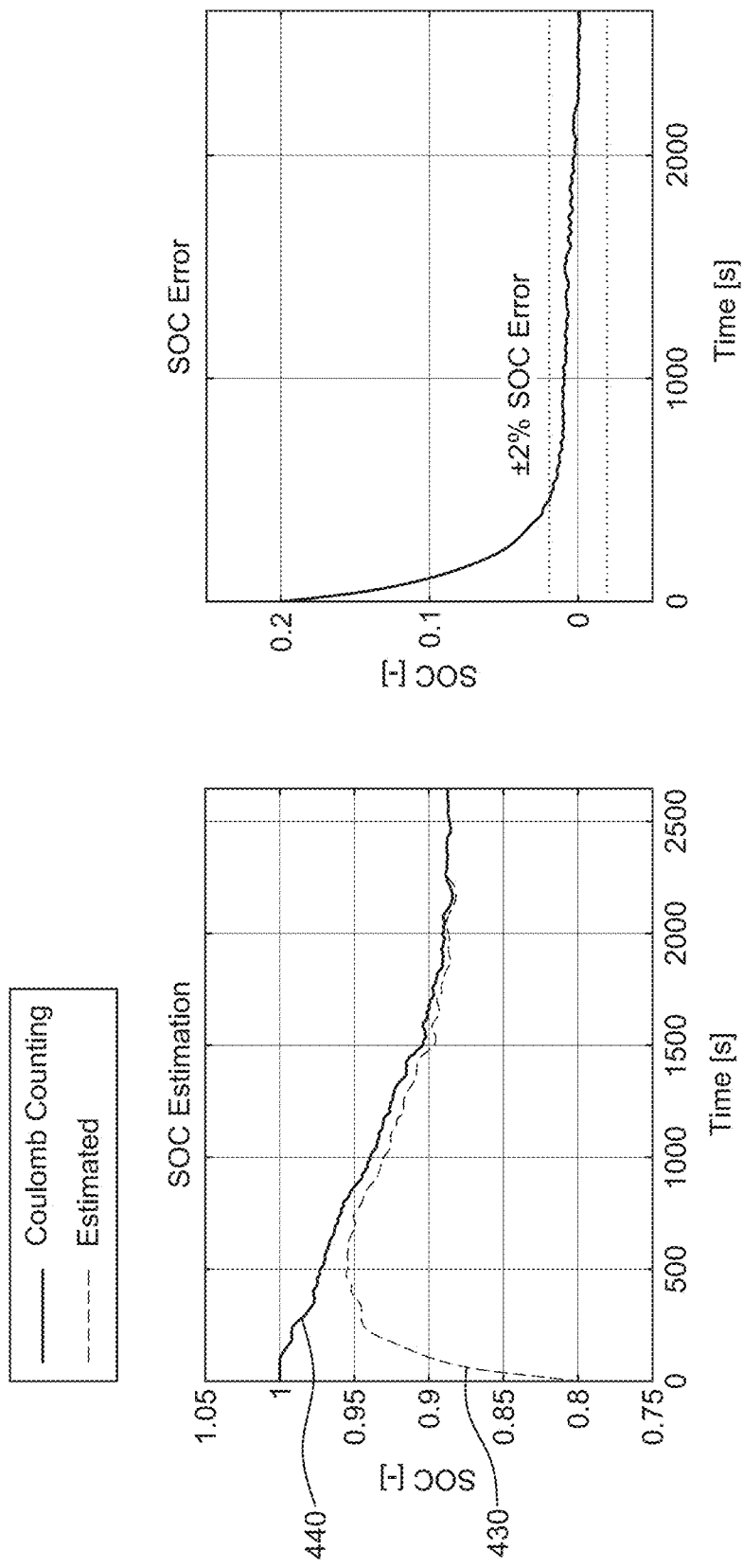
FIGS. 4C to 4E are graphical illustrations of SOC and SOH estimation in accordance with embodiments of the invention.
Figure 4D:
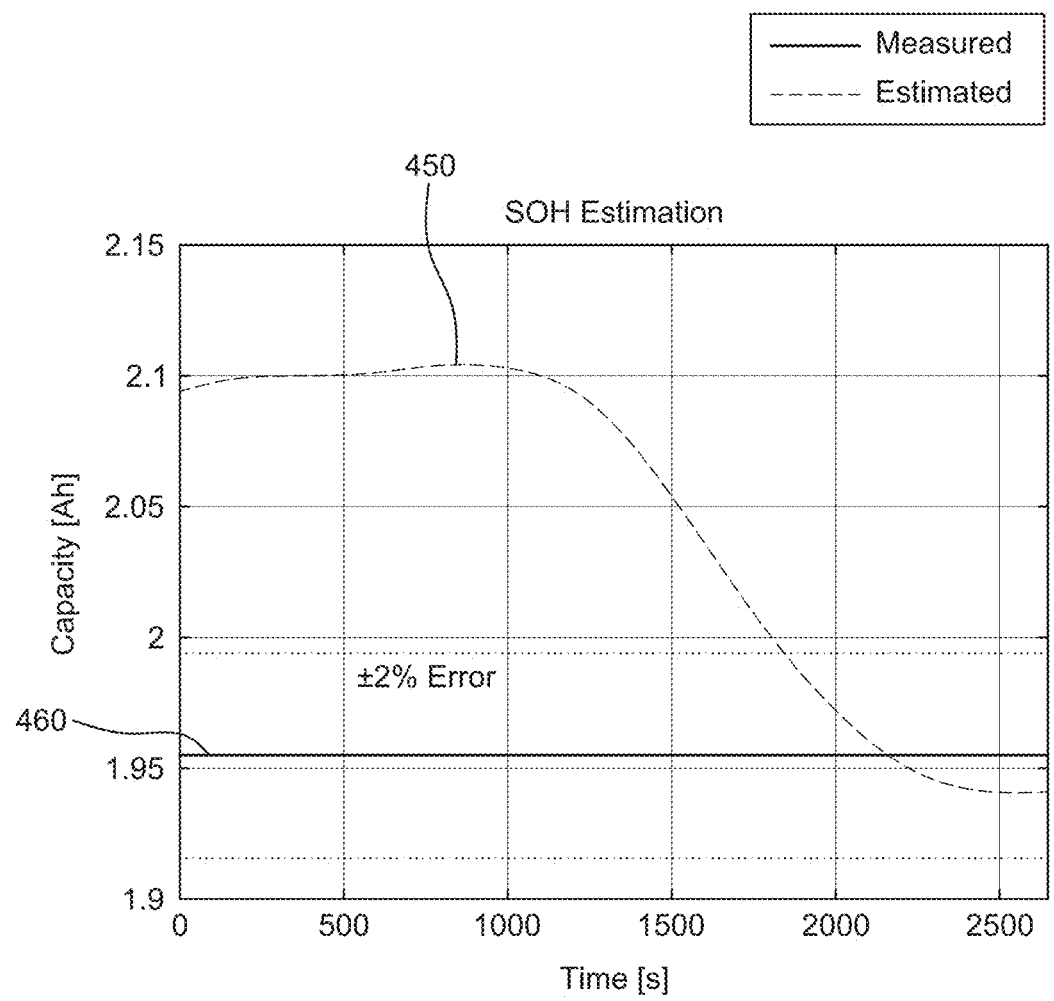

FIG. 4C illustrates two graphs with respect to the SOC estimation and SOC error. IT can be seen that the SOC estimation 430 closely matches the true SOC 440 with the bulk error falling within a 2% margin. Additionally, FIG. 4D illustrates the Capacity Estimation 450 with respect to the measured capacity 460 in a simulated system. Although the initial estimation was outside the 2% margin it was able to fall within the 2% margin during testing. In various embodiments, the data can be affected by noise generated in the system. Accordingly, some embodiments may utilize different connectors to help reduce noise which can help to improve the estimation process.

Figure 4E:
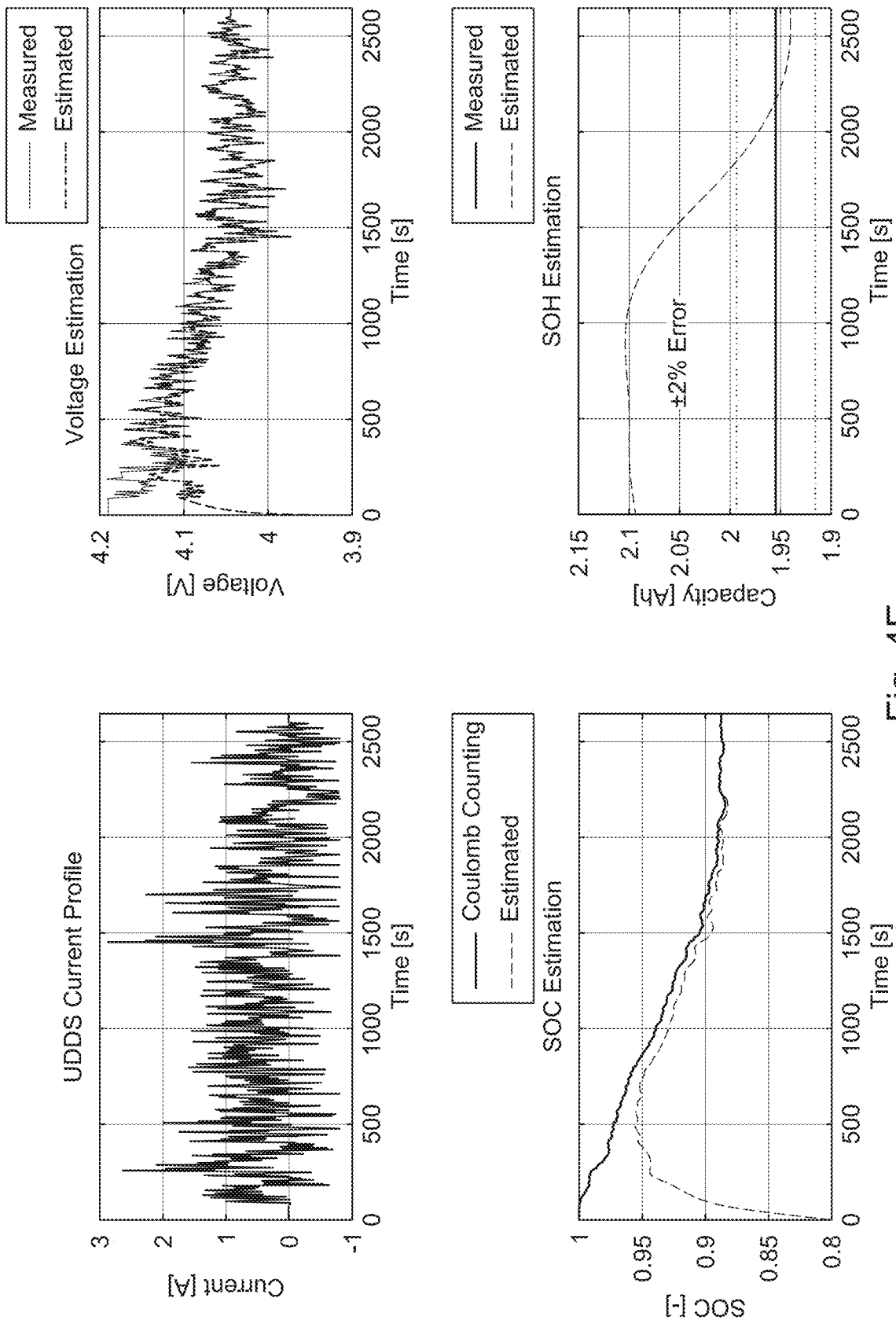

In various embodiments the SOC and SOH estimation can be done utilizing the Urban Dynamometer Driving Schedule (UDDS) for the input current profile. For example, FIG. 4E illustrates the results of the SOC, SOH, and voltage estimations versus measured values using the UDDS current input. The top left-hand graph in FIG. 4E illustrates the UDDS Current profile of amps over time that can be used in various embodiments to illustrate the effectiveness of the dual interconnected observer system as described in various embodiments. It can be seen in the top right-hand graph, the estimated voltage is a near perfect match to that of the actual measured voltage. Accordingly, the SOC and SOH estimation graphs, bottom left and right respectively, illustrate similar results to that shown in FIGS. 4C and 4D. Thus, it can be illustrated that many embodiments may illustrate a novel capability to accurately estimate a battery SOC and SOH in real time.

Figure 5:
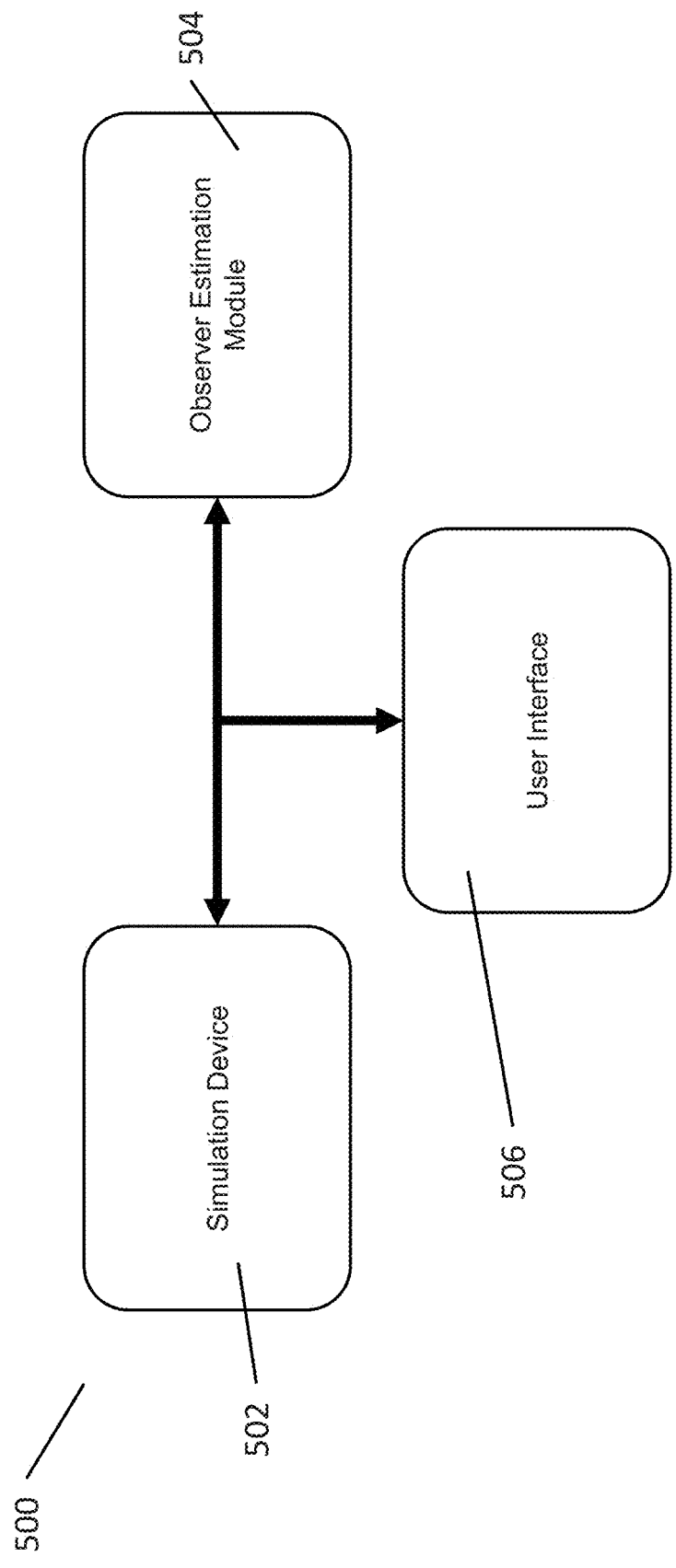
FIG. 5 illustrates a battery monitoring system in accordance with embodiments of the invention.

In a number of embodiments, the adaptive interconnected observer programming can be validated by using a Hardware in the Loop (HIL) system as illustrated in FIG. 5. A Hardwar in the Loop system 500, in accordance with some embodiments, can utilize a battery simulation device 502 to simulate the current load and changing parameters of a battery in a system. Additionally, many embodiments may incorporate an adaptive interconnected observer control module 504 that receives data from the simulation device 502 and runs the programs for the anode and cathode interconnected observers. Additionally, some embodiments may utilize a user interface system 506 that can monitor and control the flow of data between the simulation device 502 and the control module 504. Additionally, the user interface 506 can be used to interpret the data and validate the accuracy of the prediction software in the control module.

Figure 6:
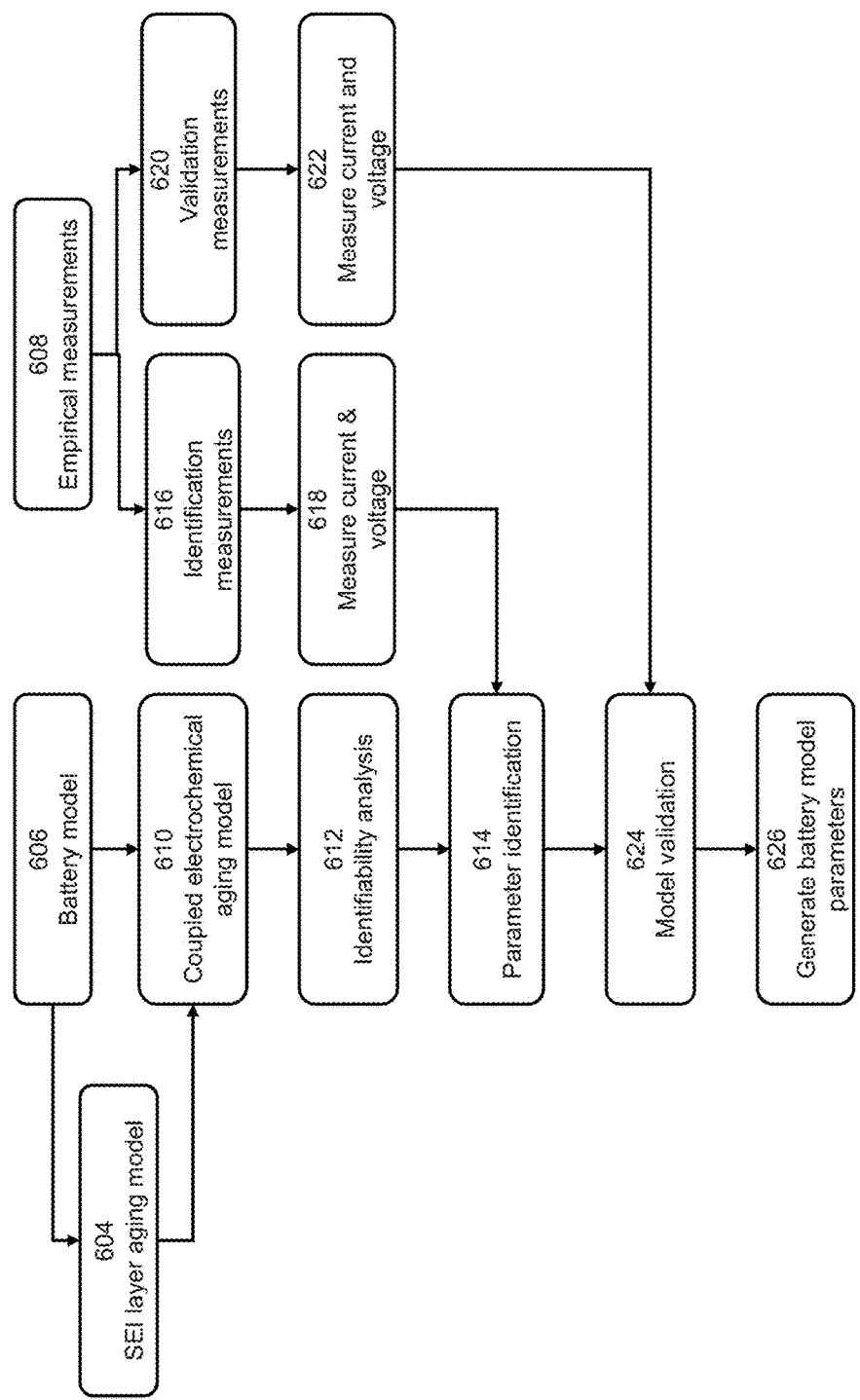
FIG. 6 illustrates a flow diagram of a modeling system in accordance with embodiments of the invention.
Figure 7:
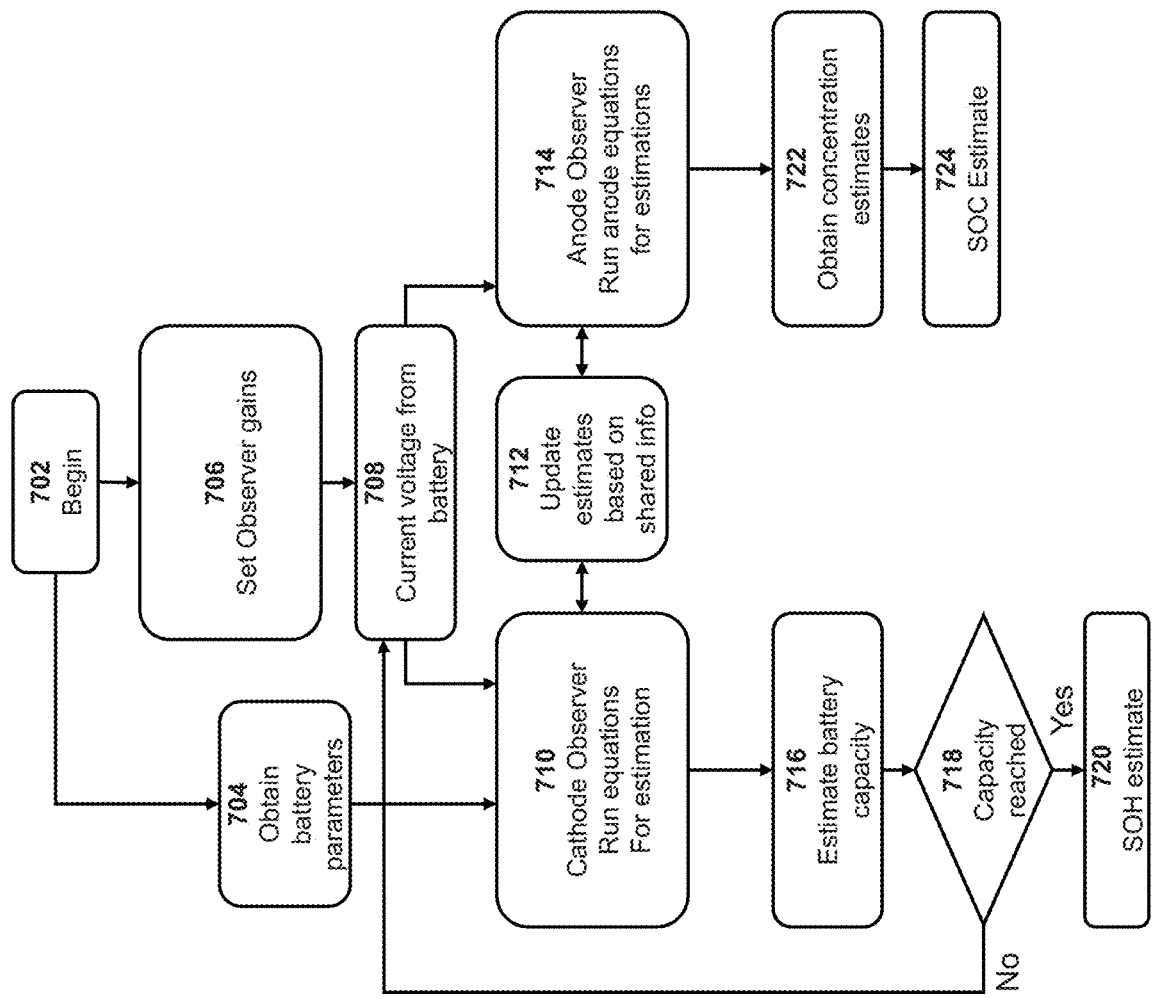
FIG. 7 illustrates a flow diagram of an adaptive observer estimation in accordance with embodiments of the invention.

Turning now to FIGS. 6 and 7, embodiments of methods for generating the battery model parameters and estimating battery SOC and SOH are illustrated. FIG. 6 illustrates an embodiment of a method for generating the battery model parameters based on the electrochemical modeling in an ESPM system. In accordance with many embodiments, the beginning steps may be the establishment of three separate variables to ultimately establish the battery parameters for the system. These steps can include obtaining or developing the SEI layer aging model thereby deriving the capacity fade and power fade relationship 604, implementing the electrochemical battery model 606, and obtaining empirical measurements 608.

In accordance with many embodiments, the battery model implementation 606 can be coupled with the SEI layer aging model to generate a coupled electrochemical aging model 610. The coupled electrochemical aging model 610 can then be used in a variety of analysis to help identify the parameters, including an identifiability analysis, a sensitivity study, and a correlation analysis 612. The parameters can then be identified 614 as the identification measurements of voltage and current are input (616 and 618). Subsequently, the model can be validated 624 using the identified parameters 614 and the validation measurements of current and voltage (620 and 622). In accordance with many embodiments, the validated model can be used to generate proper battery parameters 626 that can be used in the adaptive estimation observers to accurately estimate the SOC and SOH of the battery in real time.

FIG. 7 illustrates an embodiment of a method for estimation of the SOH and SOC using the battery parameters provided from the ESPM. In accordance with many embodiments, the beginning steps for observer estimation may include obtaining the battery parameters 702 as well as setting or tuning the gains to ensure practical stability of the states and parameters by satisfying inequalities 706. For example, there are tolerable values of errors and assumed variables in which the gains can be tuned within the adaptive interconnected observer such that the desired conditions and results are obtained. In many embodiments, the gains may be tuned by the following sequences:

1. The gains G1 and G2 can be adjusted to ensure that the trajectory of the concentration estimates from an incorrect initialized value approaches the true/reference value. The gains can be selected by fixing G1 and then tuning G2 that leads to a minimum steady state error in the estimation of cathode and anode concentration. Further, the elements of the gains G1 and G2 will be of opposite signs because as the concentration in one electrode increases, the concentration in the other electrode decreases.
2. Tuning parameter k1 can calibrated to make sure that the diffusion estimate converges to the identified diffusion coefficient of the ESPM. A tolerable value of the error is chosen assuming the maximum error that can exist in the initial condition of solid phase concentration. In many embodiments, the maximum initial error in the lithium concentration in both electrodes can be assumed to be 45% (which can be selected based on the application; for instance in a Hybrid Electric Vehicle that has a charge sustaining operation, the SOC window of operation is small and hence the initial error chosen is low, as opposed to an Electric Vehicle application where the initial error can be high).
3. The gain G3 and the tuning parameter k2 can then adjusted such that the capacity and SEI layer conductivity estimates satisfy the practical stability condition. Again, the unknown tolerable error values in real-time can be chosen by assuming the maximum initial error in the concentration of both electrodes, based on the application. Note that the estimation of capacity and SEI layer ionic conductivity begins after the lithium concentration estimates for both electrodes converge within their respective error ball. This is carried out to ensure that the capacity estimate does not show transients due to the high initial solid phase concentration error. Further, the capacity estimate is passed through a low pass filter to smooth out any remaining transients Subsequently, the observers can read or be fed the current voltage and current from the battery sensors 708. In a number of embodiments, the cathode observer can set up to receive the battery parameters 704 and run the cathode observer equations to estimate the ion concentration in the cathode, the cell capacity, as well as estimate the SEI layer ionic conductivity 710. Simultaneously, in many embodiments, the anode observer can run the anode equations using the input current and voltage to estimate the ion concentration in the anode as well as estimate the anode diffusion coefficient 712. In many embodiments, the estimates from the anode and cathode can be continuously updated 714 via the bidirectional interconnection open loops between the observers. In accordance with many embodiments, the cathode observer can estimate the battery capacity 716 and determine if the capacity has reached a steady state 718. If not information can be fed back to step 708 where the current and voltage is read from the battery sensors generate new parameters for estimating the overall health of the battery. In many embodiments, if the capacity has reached a steady state, the system can provide an SOH estimate 720.

In conjunction with the SOH estimate, the anode observer can utilize the estimated battery capacity 716 in order to obtain ion concentration estimates for both the cathode and anode 722. Such information can then be used to determine the POC estimate for the system 724. Accordingly, many embodiments can incorporate such methods into controller to help improve the overall battery management system to prevent unnecessary aging as well as improve the safety of the system.

DOCTRINE OF EQUIVALENTS

As can be inferred from the above discussion, the above-mentioned concepts can be implemented in a variety of arrangements in accordance with embodiments of the invention. Specifically, many embodiments include a battery monitoring system that incorporates an adaptive interconnected observer configuration, utilizing observers for both the anode and cathode. Moreover, many embodiments capitalize on open loop communication between observers and the incorporation of aging parameters in the estimation of the battery SOC and SOH. Achieving such functionality, according to embodiments, involves the implementation of special arrangements/designs between subsystems described above, and their equivalents.

Accordingly, although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

What is claimed is:

1. A battery monitoring system comprising:
    a battery capable of generating an electric profile signal in the form of voltage and current data;
    an adaptive cathode observer configured to receive the electric profile signal with respect to a cathode of the battery; and
    an adaptive anode observer configured to receive the electric profile signal with respect to an anode of the battery;
    wherein each of the adaptive cathode and anode observers utilize an electrochemical model of the battery to generate data describing an estimated ion concentration and a solid electrolyte interphase layer ionic conductivity at the cathode and the anode of the battery, and wherein the electrochemical model is used to calculate a state of health and a state of charge of the battery and wherein the adaptive cathode and adaptive anode observers update the estimated ion concentrations based on the calculated state of health and state of charge.

2. The battery monitoring system of claim 1, wherein the adaptive cathode and adaptive anode observers utilize open loop systems to estimate the respective ion concentrations within the battery.

3. The battery monitoring system of claim 1, wherein the electrochemical model is a solid electrolyte interphase layer aging model.

4. The battery monitoring system of claim 1, wherein the adaptive cathode and adaptive anode observers are interconnected wherein each of the adaptive cathode and anode observers can utilize information from each of the respective observers to continuously update the estimated ion concentrations using the calculated state of health and state of charge of the battery.

5. The battery monitoring system of claim 1, wherein the adaptive cathode and adaptive anode observers are integrated into an independent control unit that is connected to the battery through at least one electrical connection.

6. The battery monitoring system of claim 5, further comprising a graphical user interface system connected to the independent control unit wherein the calculated state of health and state of charge can be monitored.

7. The battery monitoring system of claim 6, wherein the graphical user interface system makes up a portion of a vehicle display system.

8. The battery monitoring system of claim 1, wherein the battery is a lithium ion battery.

9. The battery monitoring system of claim 1, wherein the estimated ion concentrations are lithium ion concentrations.

10. The battery monitoring system of claim 1, wherein the battery is part of an electric vehicle platform.

11. The battery monitoring system of claim 1, wherein the adaptive anode and adaptive cathode observers are part of a dSpace MicroAutobox controller.

12. A method for monitoring battery health comprising:
providing a battery with an anode and a cathode;
providing an adaptive anode observer for estimating an ion concentration and a solid electrolyte interphase layer ionic conductivity at the anode of the battery;
providing an adaptive cathode observer for estimating an ion concentration and a solid electrolyte interphase layer ionic conductivity at the cathode of the battery;
utilizing an electrochemical model within each of the adaptive anode and adaptive cathode observers to calculate an estimated state of charge and an estimated state of health of the battery using the estimated ion concentrations;
updating the ion concentrations based on the calculated state of charge and calculated state of health of the battery; and
updating the electrochemical model based on the updated ion concentrations.

13. The method of claim 12, wherein the adaptive cathode and adaptive anode observers utilize open loop systems to estimate the respective ion concentrations within the battery.

14. The method of claim 12, wherein the electrochemical model is a solid electrolyte interphase layer aging model.

15. The method of claim 12, wherein the adaptive cathode and adaptive anode observers are interconnected wherein each of the adaptive cathode and anode observers can utilize information from each of the respective observers to continuously update the estimated ion concentrations using the calculated state of health and state of charge of the battery.

16. The method of claim 12, wherein the adaptive cathode and adaptive anode observers are integrated into an independent control unit that is connected to the battery through at least one electrical connection.

17. The method of claim 16, further comprising a graphical user interface system connected to the independent control unit wherein the calculated state of health and state of charge can be monitored.

18. The method of claim 12, wherein the battery is a lithium ion battery.

19. The method of claim 12, wherein the estimated ion concentrations are lithium ion concentrations.

* * * * *